United States Patent
Kim et al.

(10) Patent No.: US 8,332,569 B2
(45) Date of Patent: Dec. 11, 2012

(54) NONVOLATILE MEMORY SYSTEM USING DATA INTERLEAVING SCHEME

(75) Inventors: Hyun-Ju Kim, Seoul (KR); Chang-Eun Choi, Seoul (KR); Taekeun Jeon, Seoul (KR); Kyoung Ryun Bae, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 357 days.

(21) Appl. No.: 12/820,445

(22) Filed: Jun. 22, 2010

(65) Prior Publication Data

US 2011/0035538 A1   Feb. 10, 2011

(30) Foreign Application Priority Data

Aug. 6, 2009   (KR) .......................... 10-2009-0072525

(51) Int. Cl.
*G06F 12/06* (2006.01)
(52) U.S. Cl. .............................. 711/5; 711/103; 711/157
(58) Field of Classification Search .......................... None
See application file for complete search history.

(56) References Cited

U.S. PATENT DOCUMENTS

| | | | |
|---|---|---|---|
| 6,247,104 B1 * | 6/2001 | Suzuki | 711/167 |
| 2002/0051394 A1 * | 5/2002 | Tobita et al. | 365/221 |
| 2005/0144361 A1 | 6/2005 | Gonzalez et al. | |
| 2010/0011158 A1 * | 1/2010 | Shiraishi et al. | 711/103 |
| 2010/0325349 A1 * | 12/2010 | Otsuka | 711/103 |

FOREIGN PATENT DOCUMENTS

| | | |
|---|---|---|
| JP | 08221321 A | 8/1996 |
| JP | 2003015946 A | 1/2003 |
| JP | 2007517320 A | 6/2007 |
| KR | 1020060130084 A | 12/2006 |
| WO | 2005066794 A2 | 7/2005 |

* cited by examiner

*Primary Examiner* — Than Nguyen
(74) *Attorney, Agent, or Firm* — Volentine & Whitt, PLLC (57) ABSTRACT

A memory system comprises a plurality of nonvolatile memory devices configured for interleaved access. Programming times are measured and recorded for various memory cell regions of the nonvolatile memory devices, and interleaving units are formed by memory cell regions having different programming times.

20 Claims, 10 Drawing Sheets

NONVOLATILE MEMORY SYSTEM USING DATA INTERLEAVING SCHEME

CROSS-REFERENCE TO RELATED APPLICATIONS

This application claims priority under 35 U.S.C. §119 to Korean Patent Application No. 10-2009-0072525 filed on Aug. 6, 2009, the disclosure of which is hereby incorporated by reference in its entirety.

BACKGROUND

Embodiments of the inventive concept relate generally to semiconductor memory devices. More particularly, embodiments of the inventive concept relate to methods of programming flash memory devices in a system using a data interleaving scheme.

Semiconductor memory devices can be roughly divided into two categories including volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include electrically erasable programmable read only memory (EEPROM), ferroelectric random access memory (FRAM), phase-change random access memory (PRAM), magnetoresistive random access memory (MRAM), and flash memory.

Flash memory is a form of nonvolatile memory known for having relatively high programming speed, low power consumption, and high storage capacity. Consequently, flash memory has been adopted as a storage medium in a wide variety of electronic devices, such as MP3 players, memory cards, and solid state drives (SSDs), to name but a few. NAND flash memory is one type of flash memory that can provide especially large storage capacity due to its high integration density.

Some nonvolatile memory systems comprise multiple NAND flash memory devices located in a single storage medium and controlled by a single memory controller. These devices are typically accessed in a coordinated fashion in response to commands from a host and under the control of the memory controller.

SUMMARY

Embodiments of the inventive concept provide nonvolatile memory systems and related methods of operation. In certain embodiments, a data interleaving scheme is used to improve the performance of programming operations.

According to one embodiment of the inventive concept, a method of programming is provided for a memory system comprising a plurality of nonvolatile memory devices connected to a common input/output channel. The method comprises determining programming times for data regions of the plurality of nonvolatile memory devices, wherein some of the data regions have a first programming time and some of the data regions have a second programming time longer than the first programming time. The method further comprises defining an interleaving unit comprising at least one data region having the first programming time and at least one data region having the second programming time from each of the plurality of nonvolatile memory devices. The method still further comprises programming the data regions of the interleaving unit in a sequence beginning with the data regions having the first programming time, followed by the data regions having the second programming time.

In certain embodiments, the method further comprises defining a second interleaving unit comprising at least one data region having the first programming time and at least one data region having the second programming time from each of a different two of the plurality of nonvolatile memory devices, and programming the second interleaving unit in an interleaved fashion with the first interleaving unit.

In certain embodiments, determining the programming times for the data regions comprises programming the data regions, and measuring the time required to perform the programming.

In certain embodiments, determining the programming times for the data regions comprises reading a stored indication of the programming times. In certain embodiments, the data regions having the first programming times correspond to least significant bit data in multi-bit memory cells. In certain embodiments, the data regions having the second programming times correspond to most significant bit data in multi-bit memory cells.

In certain embodiments, the nonvolatile memory devices comprise flash memory devices, and data regions comprise pages of flash memory cells. In certain embodiments, the nonvolatile memory devices comprise flash memory devices, and data regions comprise super-pages of flash memory cells, each super-page comprising one or more pages of data from one memory block, and one or more pages of data from another memory block.

According to another embodiment of the inventive concept, a method of configuring an interleaving unit in a memory system is provided. The memory system comprises a plurality of nonvolatile memory devices and a memory controller. The method comprises selecting a plurality of memory cell regions of the nonvolatile memory devices as a programming time measurement group, executing programming operations on the selected memory cell regions and recording programming times of the selected memory cell regions based on the programming operations, and configuring an interleaving unit to be used as a unit of an interleaving operation based on the recorded programming times.

In certain embodiments, the method further comprises measuring the programming times of the selected memory cell regions by monitoring a ready/busy signal of one or more of the nonvolatile memory devices during a programming operation to determine the duration of the programming operation.

In certain embodiments, executing programming operations on the selected memory cell regions and recording the programming times of the selected memory cell regions comprises an iterative process comprising a plurality of loops each comprising programming a single memory cell region and recording a characteristic of the single memory cell region.

In certain embodiments, the characteristic of the memory cell region is a programming time. In certain embodiments, recording the programming times comprises is performed by a timer or counter of the memory controller.

In certain embodiments, the interleaving unit comprises a first memory cell region having a first programming time and a second memory cell region having a second programming time greater than the first programming time.

In certain embodiments, the interleaving unit comprises at least one data region having the first programming time and at least one data region having the second programming time from each of two different nonvolatile memory devices.

In certain embodiments, the first memory cell region comprises a page of lower bit data in a flash memory device, and the second memory cell region comprises a page of upper bit data in the flash memory device.

According to still another embodiment of the inventive concept, a memory system comprises a plurality of nonvolatile memory devices, and a memory controller that exchanges data with the nonvolatile memory devices through at least one channel, selects a plurality of memory cell regions of the nonvolatile memory devices as a programming time measurement group, executes programming operations on the selected memory cell regions and recording programming times of the selected memory cell regions based on the programming operations, and configures an interleaving unit to be used as a unit of an interleaving operation based on the recorded programming times. The nonvolatile memory devices comprise a first nonvolatile memory device and a second nonvolatile memory device, and the memory controller sequentially drives first and second programming units in the first and second nonvolatile memory devices, the first programming units having a first programming time, and the second programming units having a second programming time longer than the first programming time.

In certain embodiments, the memory controller measures the programming times of the selected memory cell regions by performing an iterative process comprising a plurality of loops each comprising programming a single memory cell region and recording a programming time of the single memory cell region.

In certain embodiments, the interleaving unit comprises a small interleaving unit or a large interleaving unit, wherein the small interleaving unit comprises a programming unit having a first programming time and a programming unit having a second programming time greater than the first programming time, and wherein the large interleaving unit comprises at least two small interleaving units.

In certain embodiments, an interleaving operation of the memory system is performed by interleaving the programming of at least two small interleaving units and interleaving the programming of at least two large interleaving units.

BRIEF DESCRIPTION OF THE DRAWINGS

Embodiments of the inventive concept are described below with reference to the corresponding drawings. In the drawings, like reference numbers denote like features.

DETAILED DESCRIPTION OF THE EMBODIMENTS

Embodiments of the inventive concept are described below with reference to the accompanying drawings. The described embodiments are provided as teaching examples and should not be construed to limit the scope of the inventive concept.

As used herein, the term "and/or" encompasses any and all combinations of one or more of the associated listed items. It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the inventive concept will be described in detail with reference to the accompanying drawings.

Figure 1:
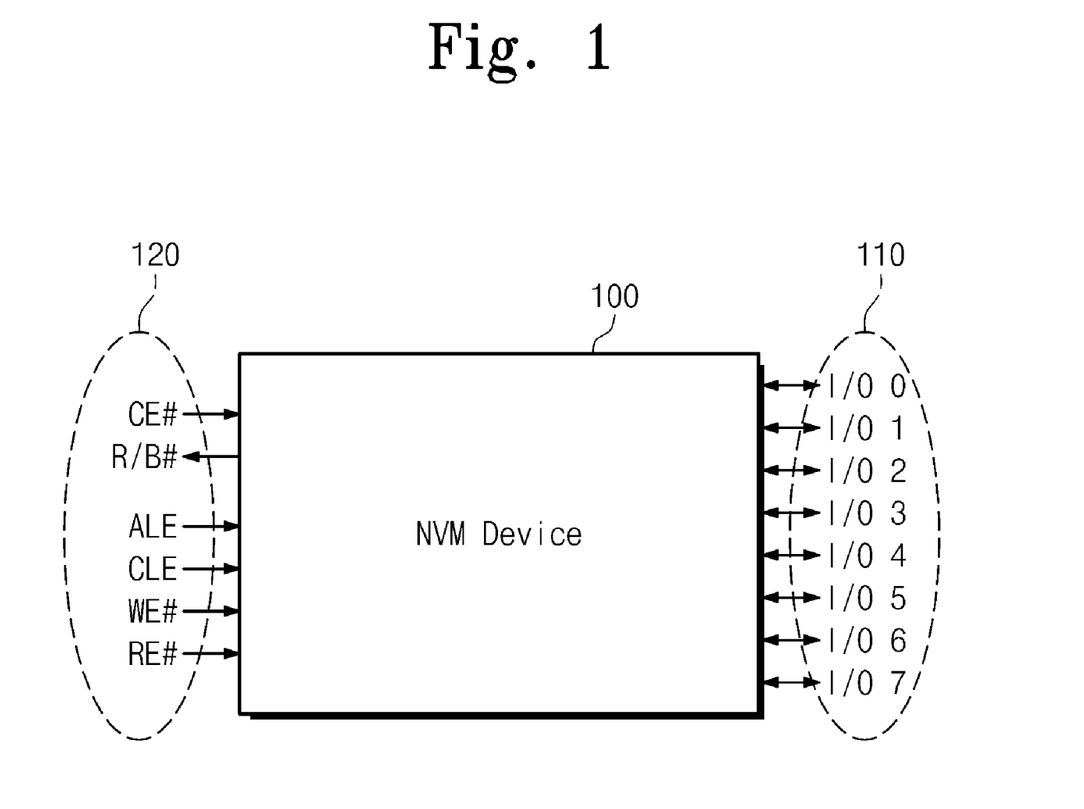
FIG. 1 is a block diagram illustrating a nonvolatile memory device according to an embodiment of the inventive concept.

FIG. 1 is a block diagram illustrating a nonvolatile memory device according to an embodiment of the inventive concept. In this embodiment, the nonvolatile memory device comprises a NAND flash memory device 100. In other embodiments, the nonvolatile memory device could comprise a NOR flash memory, a phase-change random access memory (PRAM), a ferroelectric random access memory (FRAM), a magnetoresistive random access memory (MRAM), or any of several other types of nonvolatile memory.

Referring to FIG. 1, NAND flash memory device 100 comprises an input/output terminal 110 for receiving and transmitting command, address, and data signals, and a control signal terminal 120 for receiving and transmitting control signals.

Input/output terminal 110 comprises input/output ports I/O 0 through 7 for receiving and transmitting eight bits of data at a time. Commands, addresses, and data are received and transmitted via input/output terminal 110 according to the control signals received by control signal 120. For example, a command latch enable signal CLE received by control signal terminal 120 controls the timing for receiving command signals via input/output terminal 110.

Control signal terminal 120 receives or transmits the following signals: a chip enable signal CE#, a ready/busy signal R/B#, an address latch enable signal ALE, command latch enable signal CLE, a write enable signal WE# and a read enable signal RE#. In the signal names, the pound symbol # denotes signals that are asserted, or activated, with a low logic level. The other signals are activated with a high logic level.

Chip enable signal CE# is activated to allow flash memory device 100 to receive a command, an address or data. Ready/busy signal R/B# is activated to indicate that flash memory device 100 is busy executing a command. Address latch enable signal ALE is activated to allow flash memory device 100 to receive an address. For instance, where address latch enable signal ALE is activated, flash memory device 100 recognizes signals received at input/output terminal 110 as an address. Command latch enable signal CLE is activated to allow flash memory device 100 to receive a command. Where command latch enable signal CLE is activated, flash memory device 100 recognizes signals received at input/output terminal 110 as a command.

Write enable signal WE# is activated to allow flash memory device 100 to receive data. In other words, activation of write enable signal WE# causes input/output terminal 110 to act as an input terminal. Read enable signal RE# is activated to allow flash memory device 100 to transmit data. In other words, activation of read enable signal RE# causes input/output terminal 110 to act as an output terminal.

Figure 2:
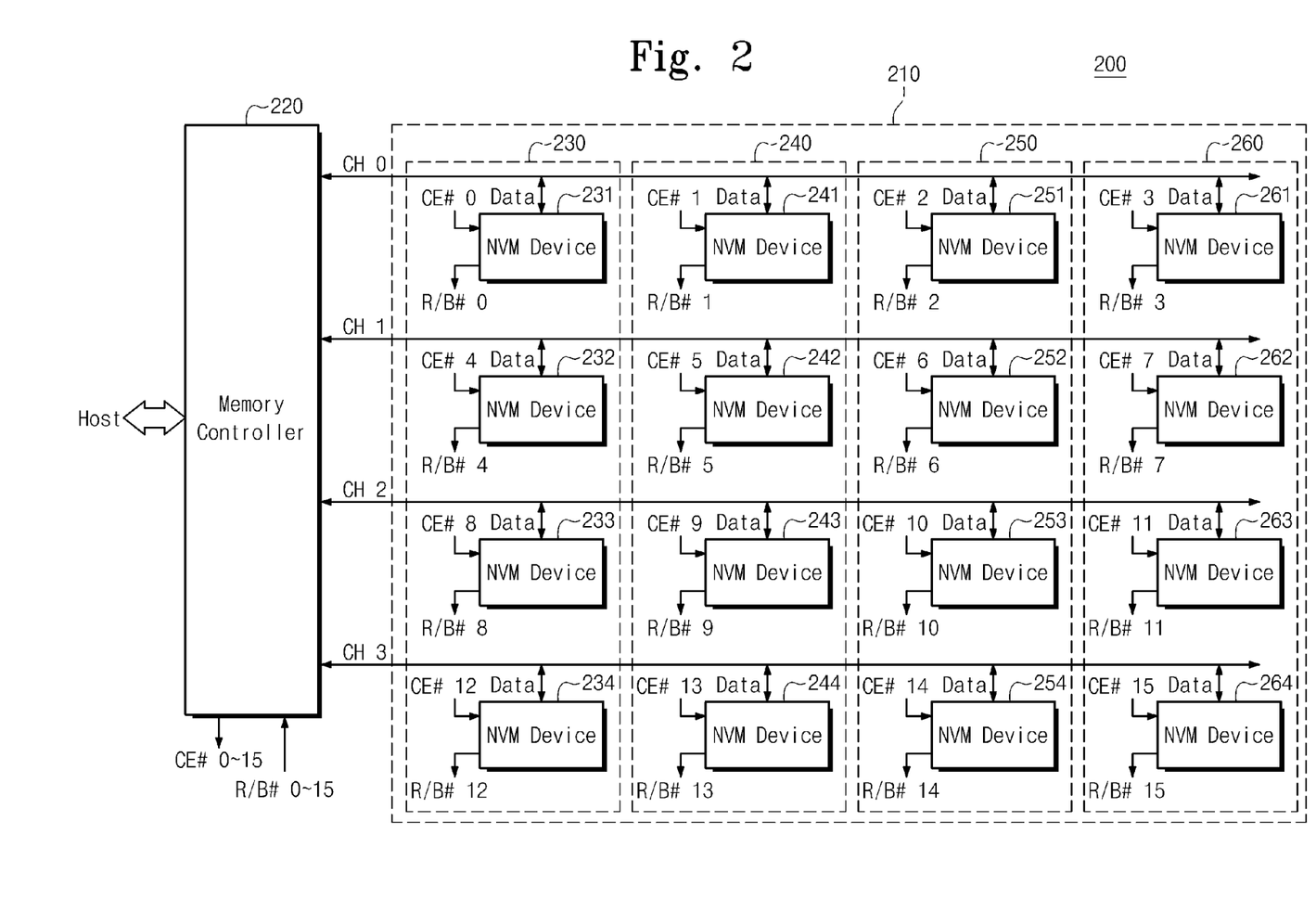
FIG. 2 is a block diagram illustrating a memory system according to an embodiment of the inventive concept.

FIG. 2 is a block diagram illustrating a memory system according to an embodiment of the inventive concept.

Referring to FIG. 2, memory system 200 comprises a storage medium 210 and a memory controller 220. Storage medium 210 comprises a plurality of flash memory devices each operating with substantially the same interface scheme as nonvolatile memory device 100 of FIG. 1. Memory controller 220 controls data exchange between the flash memory devices of storage medium 210 and a host. That is, memory controller 220 generates signals to be applied to the flash memory devices of storage medium 210 and exchanges data with the flash memory devices in response to requests from the host.

The flash memory devices are arranged in four groups 230, 240, 250 and 260, where each group comprises four flash memory devices. For instance, a first group 230 comprises flash memory devices 231 through 234.

Memory controller 220 is connected to groups 230, 240, 250 and 260 via four channels CH 0 through CH 3. For instance, four flash memory devices 231, 241, 251 and 261 are connected to channel CH 0. In this embodiment, each channel comprises a bus shared by multiple flash memory devices.

The performance of memory system 200 can be improved by allowing interleaved access to the flash memory devices in different channels. Interleaved access is achieved by reading or writing data in one flash memory device while transferring data to or from another flash memory device. For example, flash memory devices 231 and 232 can be accessed in an interleaved fashion by transmitting a command, data and an address to flash memory device 232 via channel CH 0 while flash memory device 231 reads or writes data by transferring the data between a page buffer and a memory cell array.

In the embodiment of FIG. 2, flash memory devices connected to the same channel receive separate chip enable signals and ready/busy signals, but otherwise receive the same signals. For instance, nonvolatile memory devices 231, 241, 251, and 261 receive different chip enable signals CE# 0 through CE# 3, and different read/busy signals R/B# 0 through R/B# 3. However, these nonvolatile memory devices receive the same signals on their respective I/O ports 0 through 7, as well as the same address latch enable signals ALE, command latch signals CLE, and so on.

Upon initial mounting of flash memory devices in memory system 200, memory controller 220 executes various initialization operations, such as read identification (ID) operations, bad block scanning operations, system code storing operations, and address mapping operations.

The read ID operation detects characteristics of the flash memory devices, such as storage capacity, page size, and so on. The bad block scanning operation identifies bad blocks in the flash memory devices, which are blocks that do not properly execute read, write, or erase operations, e.g., because certain memory cells have deteriorated. Based on the bad block scanning operation, memory controller 220 writes a bad block table and refers to the bad block table to avoid using bad blocks.

The system code storing operation stores system code in storage medium 210 to control or configure the flash memory devices. The address mapping operations write a mapping table and store the table in storage medium 210. The mapping table typically comprises information for mapping between logical and physical addresses of the flash memory devices in storage medium 210.

In the initialization operations performed by memory controller 220, memory system 200 measures page programming times of flash memory devices and configures interleaving units based on the measured page programming times. A page is a basic unit of programming operations of the flash memory device, and an interleaving unit is a unit of multiple pages that are programmed or read in an interleaved fashion. Memory controller 220 can configure a plurality pages to be transferred to storage medium 210 during an interleaving unit.

Figure 3:
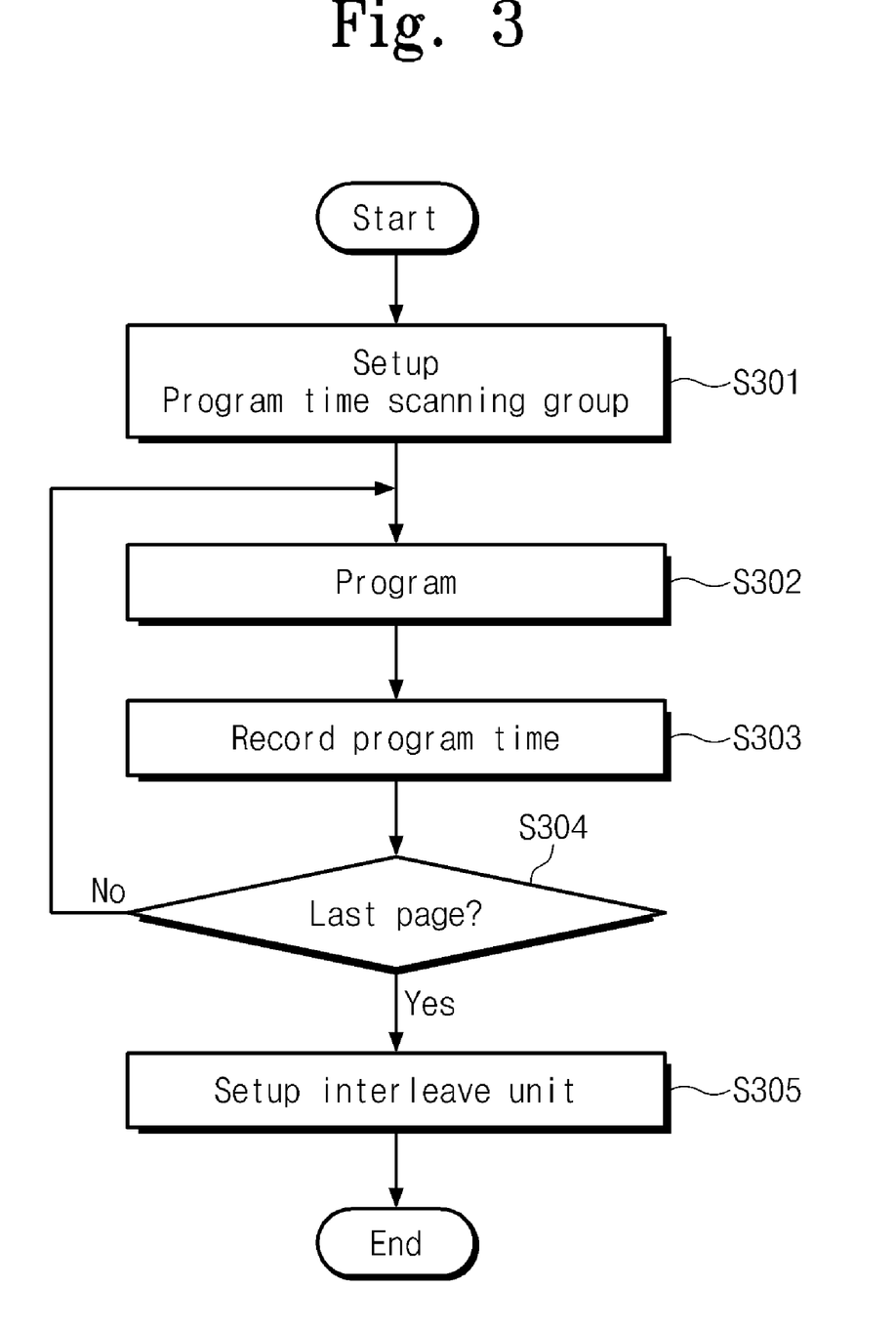
FIG. 3 is a flow chart illustrating a method of determining an interleaving unit of a nonvolatile memory device according to an embodiment of the inventive concept.

FIG. 3 is a flow chart illustrating a method of determining an interleaving unit of memory system 200 according to an embodiment of the inventive concept. In the description that follows, example method steps are denoted by parentheses (SXXX).

In the method of FIG. 3, memory controller 220 sets a programming time measurement group (or scanning group), which is a group of pages to be subjected to programming time measurements (S301). In certain embodiments, the programming time measurement group comprises all pages of a flash memory device, or any arbitrary unit of a flash memory device, such as one or more blocks. In some embodiments, memory controller 220 sets the programming time measurement group based on ID information of a flash memory device. For instance, memory controller 220 may set a first block of the flash memory device as the programming time measurement group, and may determine the number and size of pages in the first block based on a stored block size and a page size in the ID information. In one example, the block size of the first block is 128 KB, the page size is 2 KB, and the programming time measurement group is set with all 64 pages in the first block.

Once the program time measurement group is established, memory controller 220 programs a first page of memory cells in the group (S302). For simplicity, memory controller 220 can program the page with a standard data pattern, and then program subsequent pages with the same page. Alternatively, memory controller 220 can program each page with any other data pattern.

Memory controller 220 measures and records the time required to program the first page (S303). The measurement can be performed, for instance, by transmitting a command, address, and data to the flash memory device, waiting until the data is loaded in a page buffer of the flash memory device, and then transmitting a second command, address, and data. At this point, memory controller 220 starts measuring programming time using a timer or a counter. Memory controller 220 checks the ready/busy signal R/B# of the flash memory device to determine when programming is completed. Once the ready/busy signal R/B# changes from a low voltage state to a high voltage state, memory controller 220 completes the programming time measurement and stores the measured page programming time in a storage region of memory controller 220. The recorded page programming time can be used subsequently to configure an interleaving unit.

Following measurement and recording of the programming time, memory controller 220 determines whether the programmed page is a last page in the programming time measurement group (S304). Where the page is not the last page in the programming time measurement group (S304=No), steps S302 through S304 are repeated for a next page. Otherwise (S304=Yes), program time measurements are completed and the method proceeds to set up an interleaving unit based on the measured programming times (S305).

Figure 5A:
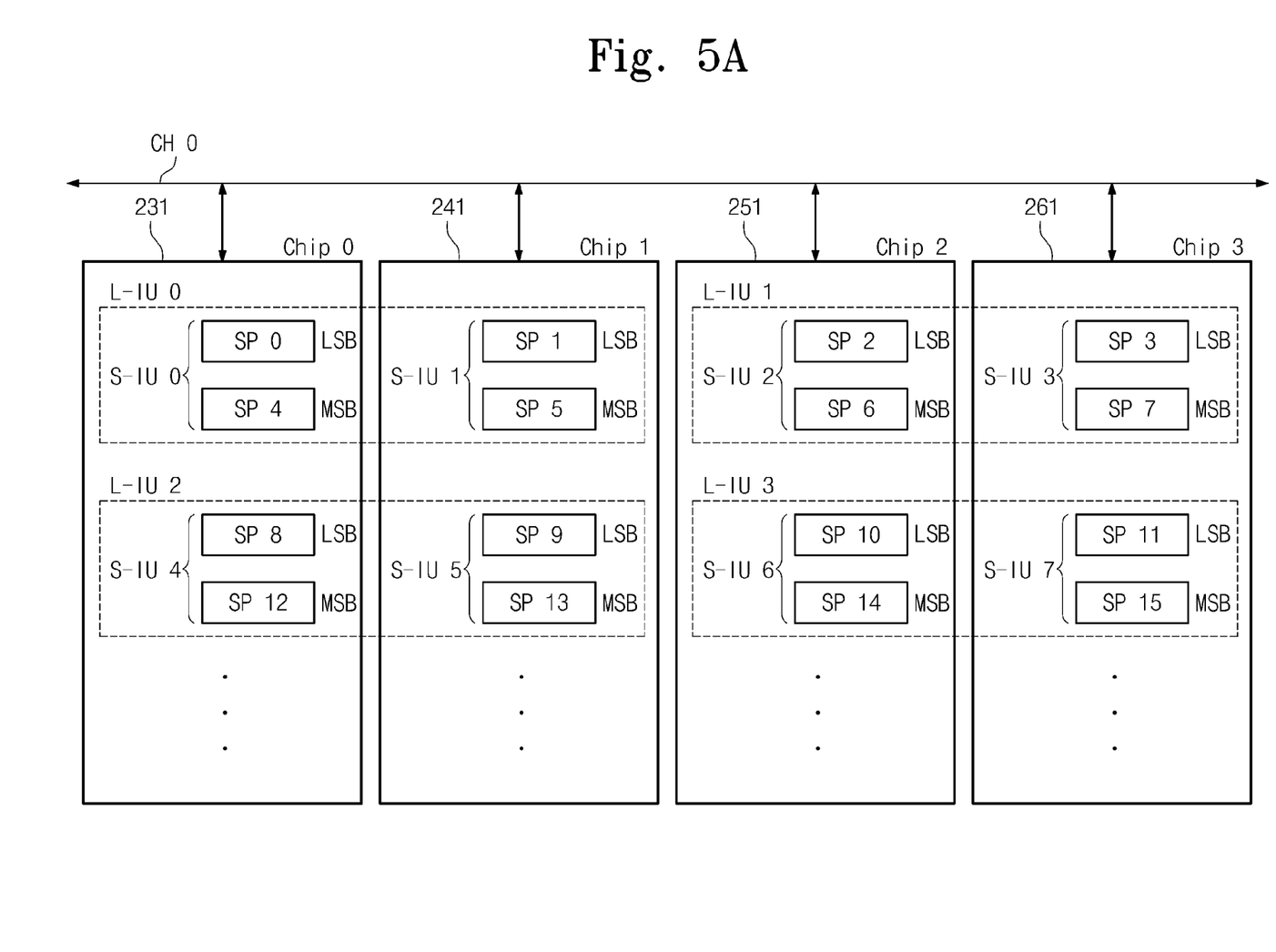
FIG. 5A is a block diagram illustrating a method of determining an interleaving unit of a nonvolatile memory device according to an embodiment of the inventive concept.
Figure 5B:
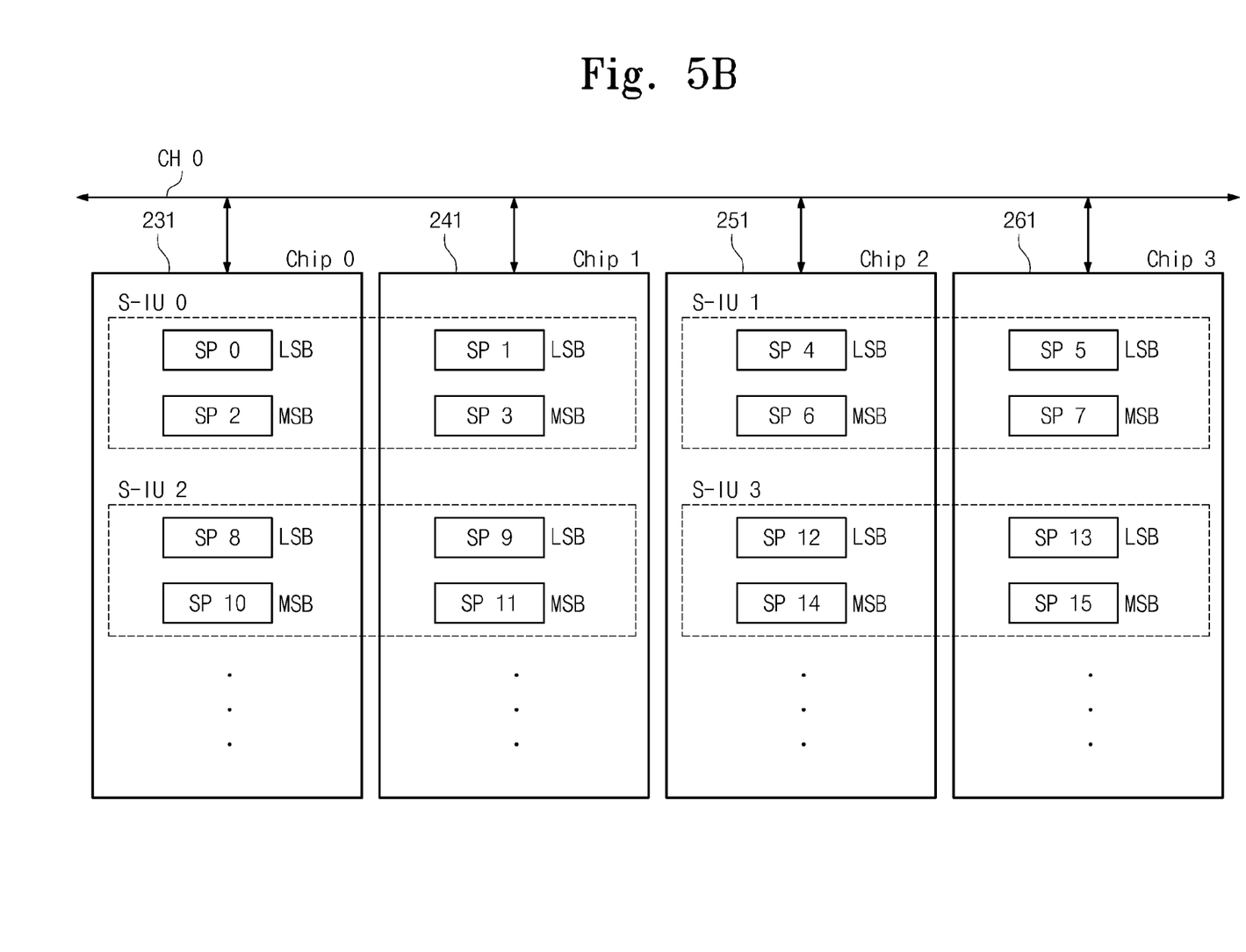
FIG. 5B is a block diagram illustrating a method of determining an interleaving unit of a nonvolatile memory device according to another embodiment of the inventive concept.

In certain embodiments, memory controller 220 forms an interleaving unit by grouping pages having relatively short programming times with pages having relatively long programming times. For instance, as illustrated in FIGS. 5A and 5B, which is described below, a page of least significant bit (LSB) data can be grouped with a page of most significant bit (MSB) data in an interleaving unit.

Figure 4:
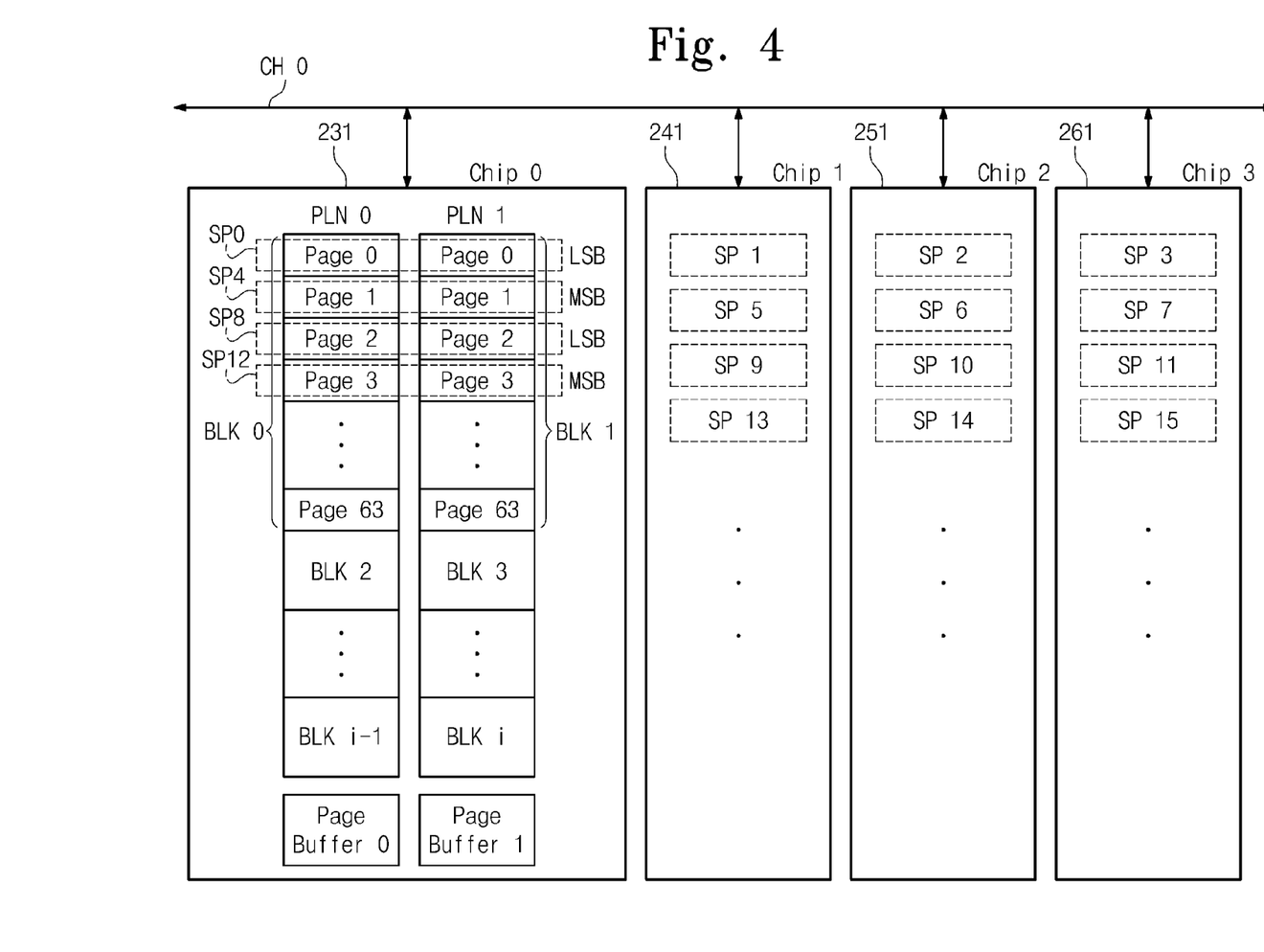
FIG. 4 is a block diagram illustrating a memory cell array in a nonvolatile memory device of FIG. 2.

In certain embodiments, a small interleaving unit is formed by a page having a relatively short programming time and a page having a relatively long programming. Such small interleaving units can be grouped together to form large interleaving units. FIGS. 4 and 5 illustrate various example methods for forming such interleaving units.

FIG. 4 is a diagram illustrating flash memory devices 231, 241, 251 and 261 connected to channel CH 0 in FIG. 2. The memory cell arrays of flash memory devices 231, 241, 251 and 261 are divided into pages, blocks, and planes. Each plane comprises a plurality of blocks and each block comprises a plurality of pages. For instance, flash memory device 231 comprises planes PLN0 and PLN1. Plane PLN0 comprises blocks BLK0, BLK2, . . . BLKi-1. Block BLK0 comprises pages Page 0, Page 1, . . . , page 63. Similarly, plane PLN1 comprises blocks BLK1, BLK3, . . . , BLKi, and block BLK1 comprises pages Page 0, Page 1, . . . , Page 63. Each of the flash memory devices 231, 241, 251 and 261 comprises a page buffer for each plane. For instance, flash memory device 231 comprises a page buffer 0 corresponding to plane PLN0, and a page buffer 1 corresponding to plane PLN1.

Each flash memory device executes programming operations in page units, where each page comprises a plurality of memory cells connected to a common wordline. Each page of memory cells may comprise multiple pages of data, such as an MSB page and an LSB page in a multi-level cell (MLC) flash memory device where each memory cell stores two bits of data. In the embodiments of FIGS. 4 and 5, MSB pages have relatively long programming times, and LSB pages have relatively short programming times. Moreover, in these embodiments, it is assumed that different MSB pages have similar programming times, and different LSB pages have similar programming times.

The two planes in each of flash memory devices 231, 241, 251, and 261 are configured for parallel operation. For instance, in flash memory device 231, planes PLN0 and PLN1 can be simultaneously accessed to store data in the corresponding page buffers 0 and 1. In general, the page buffers in flash memory devices 231, 241, 251, and 261 can be used to store data to be written in selected pages during write operations, and data read from selected pages in read operations.

In the embodiments of FIGS. 4 and 5, certain pages are grouped together to form super pages. For instance, Page 0 in plane PLN0, and Page 0 in plane PLN1 are grouped together to form a first super page SP0. Other pages in planes PLN0 and PLN1 are similarly grouped to form super pages SU4, SU8, and so on. In various alternative embodiments, the respective sizes of the super pages can be changed to include more than two pages.

As illustrated in FIG. 4, memory controller 220 can configure super pages for all the memory cell array regions of flash memory devices 231, 241, 251 and 261 that are connected to channel CH 0. Moreover, the memory system of FIG. 2 can configure super pages for all the memory cell array regions of the flash memory devices that connected to channels CH 0 through CH 3.

FIG. 5A illustrates a method of defining an interleaving unit according to an embodiment of the inventive concept. In this embodiment, memory controller 220 combines a plurality of super pages to form an interleaving unit. More specifically, memory controller combines super pages having different programming times to form an interleaving unit, based on the programming times measured in operation S303.

Referring to FIG. 5A, memory controller 220 forms a first small interleaving unit S-IU 0 in flash memory device 231 with super page SP 0 having a short programming time and super page SP 4 having a long programming time. Similarly, memory controller 220 forms a small interleaving unit S-IU 1 in flash memory device 241 with super page SP 1 having a short programming time and super page SP 5 having a long programming time.

Memory controller 220 can also form large interleaving units by combining small interleaving units. For instance, in FIG. 5A, a may configure a plurality of small interleaving units as a large interleaving unit. For example, a large interleaving unit L-IU 0 is formed by small interleaving unit S-IU 0 and small interleaving unit S-IU 1. Similarly, memory controller 220 forms a large small interleaving unit L-IU 1 with small interleaving units S-IU 2 and S-IU 3 as shown in FIG. 5A. Memory controller 220 forms other large interleaving units L-IU 2, L-IU3, and so on, as illustrated in FIG. 5A.

As explained below with reference to FIG. 6A, memory controller 220 executes an interleaving operation involving interleaved access to large interleaving units L-IU 0 and L-IU 1.

FIG. 5B illustrates a method or forming an interleaving unit according to another embodiment of the inventive concept. In this embodiment, memory controller 220 uses a different set of super pages to form small interleaving units S-IU 0, S-IU 1, and so on.

Referring to FIG. 5B, memory controller 220 combines various pages having short programming times (i.e., LSB pages) and pages having long programming times (i.e., MSB pages) of first and second flash memory devices 231 and 241 to form small interleaving units S-IU 0 through S-IU 3. Similarly, memory controller 220 combines the pages (i.e., LSB pages) having short programming time and pages (i.e., MSB pages) having long programming time of the third and fourth flash memory devices 251 and 261 to configure a small interleaving unit S-IU 1.

After forming interleaving units using the above-described method, memory controller 220 configures an order of the super pages in the interleaving units. In one example, memory controller 220 configures a first page (i.e., LSB page) of first flash memory device 231 as first super page SP 0, configures a first page (i.e., LSB page) of second flash memory device 241 as second super page SP 1, configures a second page (i.e., MSB page) of first flash memory device 231 as third super page SP 2, and configures a second page (i.e., MSB page) of the second flash memory device 241 as fourth super page SP 3.

In another example, memory controller 220 configures a second page (i.e., MSB page) of second flash memory device 241 as first super page SP 0, configures a second page (i.e., MSB page) of first flash memory device 231 as second super page SP 1, configures the first page (i.e., LSB page) of second flash memory device 241 as third super page SP 2, and configures the first page (i.e., LSB page) of first flash memory device 231 as fourth super page SP 3.

In yet another example, memory controller 220 memory controller 220 configures a first page (i.e., LSB page) of first flash memory device 231 as first super page SP 0, configures a second page (i.e., MSB page) of second flash memory device 241 as second super page SP 1, configures a first page (i.e., LSB page) of second flash memory device 241 as third super page SP 2, and configures a second page (i.e., MSB page) of first flash memory device 231 as the fourth super page SP 3.

In still another example, memory controller 220 configures a first page (i.e., LSB page) of the first flash memory device 231 as first super page SP 0, configures second page (i.e., MSB page) of first flash memory device 231 as second super page SP 1, configures a second page (i.e., MSB page) of second flash memory device 241 as third super page SP 2, and configures a first page (i.e., LSB page) of second flash memory device 241 as fourth super page SP 3.

In still another example, memory controller 220 configures a second page (i.e., MSB page) of first flash memory device 231 as first super page SP 0, configures a first page (i.e., LSB page) of first flash memory device 231 as second super page SP 1, configure a first page (i.e., LSB page) of second flash memory device 241 as third super page SP 2, and configures a second page (i.e., MSB page) of second flash memory device 241 as fourth super page SP 3.

Figure 6A:
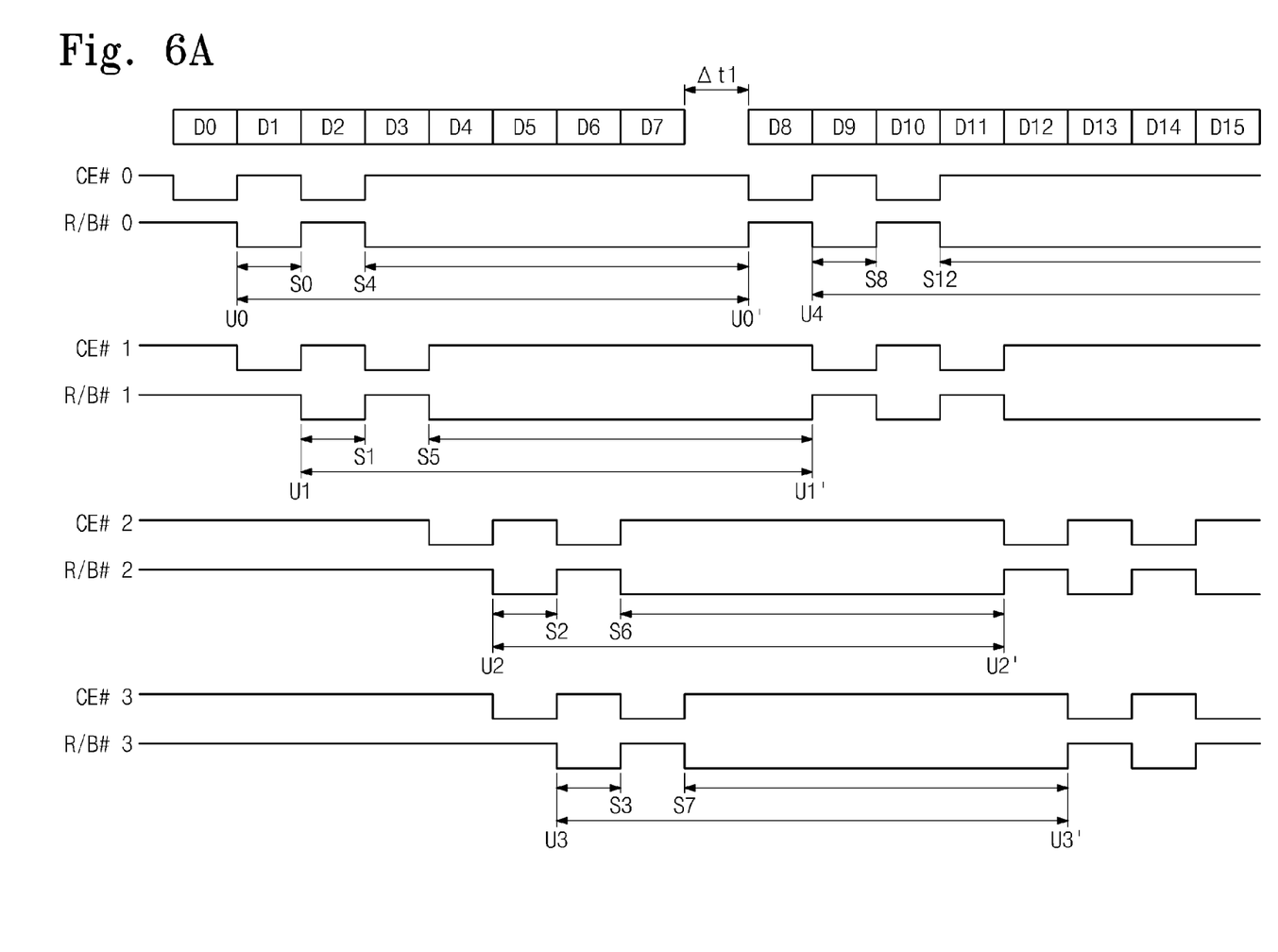
FIG. 6A is a timing diagram illustrating a method of programming a nonvolatile memory device according to an embodiment of the inventive concept.

FIG. 6A is a timing diagram illustrating a method of programming a flash memory device according to an embodiment of the inventive concept. The method of FIG. 6A corresponds to the interleaving configuration described in relation to FIG. 5A, which also relates to the system illustrated in FIG. 2. Accordingly, the method of FIG. 6A will be described with reference to all of FIGS. 2, 5A, and 6A. Additionally, the programming method of FIG. 6A is described in relation to flash memory devices 231, 241, 251 and 261 connected to channel CH 0 of FIG. 2. The described method, however, can be applied to other flash memory devices, including those connected to other channels.

Referring to FIGS. 2, 5A and 6A, memory controller 220 transmits a first command, an address, and data D0 for programming the super page SP 0 in small interleaving unit S-IU 0 of first flash memory device 231. At this point, chip enable CE# 0 signal of first flash memory device 231 maintains logic level '0' (i.e., a low level), and chip enable signals CE# 1, CE# 2 and CE# 3 of respective flash memory devices 241, 251 and 261 maintain logic level '1' (i.e., a high level).

Data transmitted to first flash memory device 231 is loaded in page buffers 0 and 1. Operations in which memory controller 220 transmits a command, address and data, and a flash memory device loads the transmitted data in a page buffer, will be referred to collectively as a setup operation.

Where a second command is transmitted from memory controller 220, first flash memory device 231 programs data stored in page buffers 0 and 1 in selected memory cells. At this point, first flash memory device 231 is in a busy state and ready/busy R/B# 0 signal is maintained at logic level '0' during an interval between time points U0 and S0 in FIG. 6A (denoted U0-S0). An operation in which a flash memory device programs data from a page buffer into selected memory cells is referred to as a programming operation.

During interval U0-S0, memory controller 220 transmits a first command, an address and data D1 for programming super page SP 1 in the small interleaving unit S-IU 1 of second flash memory device 241. At this point, chip enable signal CE# 1 signal of second flash memory device 241 maintains logic level '0' and chip enable signals CE# 0, CE# 2 and CE# 3 of respective flash memory devices 231, 251 and 261 maintain logic level '1'.

During an interval U1-S1 while data transmitted to second flash memory device 241 is loaded in a page buffer and programmed in selected memory cells, second flash memory device 241 assumes a busy state and ready/busy signal R/B# 1 is maintained at logic level '0'. During interval U0-S0, memory controller 220 checks whether the programming of super page SP 0 of first flash memory device 231 is completed based on ready/busy signal R/B# 0.

Where programming of super page SP 0 is completed and ready/busy signal R/B# 0 of first flash memory device 231 assumes logic level '1', memory controller 220 transmits a first command, an address, and data D2 for programming super page SP 4 of small interleaving unit S-IU 0. The data transmitted to first flash memory device 231 is loaded in page buffers 0 and 1, and while selected memory cells are programmed, first flash memory device 231 is in a busy state and ready/busy signal R/B# 0 maintains logic level '0' during an interval S4-U0. During interval S4-U0, memory controller 220 programs data D3-D7 in small interleaving units S-IU 2 and S-IU 3 and large interleaving unit L-IU 1 according to an interleaving scheme.

In the embodiment of FIG. 6A, super page SP 4 of small interleaving unit S-IU 0 has a relatively long programming time, and memory controller 220 executes an interleaving operation in small interleaving units and large interleaving units during the long programming time. For example, as illustrated, an interleaving operation is executed using large interleaving unit L-IU 0 comprising small interleaving units S-IU 0 and S-IU 1, and large interleaving unit L-IU 1 comprising small interleaving units S-IU2 and S-IU 3.

While a super page SP 7 in small interleaving unit S-IU 3 of fourth flash memory device 261 is being programmed during an interval S7-U3, memory controller 220 checks whether programming of super page SP 4 of first flash memory device 231 is completed through a ready/busy signal R/B# 0. Where the programming of super page SP 4 is completed and ready/busy signal R/B# 0 of first flash memory device 231 assumes logic level '1', memory controller 220 programs data D8 in a super page SP 8 included in a small interleaving unit S-IU 4.

Memory controller 220 sets up a command, address and data D7 for programming a super page SP 7, and waits a standby time $\Delta t1$ until a setup operation begins on a command, address and data D8 for programming a super page SP 8. Memory controller 220 programs successive data D9-D15 in small interleaving units and large interleaving units through an interleaving scheme until a programming operation is completed.

In the embodiment of FIG. 6A, memory controller 220 programs flash memory devices in an order determined by interleaving units. The embodiment of FIG. 6A can be contrasted with a scheme illustrated in FIG. 6B, described below, where memory controller 220 programs flash memory devices in an order super pages used to manage individual flash memory devices.

In the embodiment of FIG. 6A, large interleaving unit L-IU 0 comprises super pages SP 0 and SP 1 comprising LSB pages having relatively short programming times, and super pages super pages SP 4 and SP 5 comprising MSB pages having relatively long programming time. Large interleaving unit L-IU 1 comprises super pages SP 2 and SP 3 comprising LSB pages having relatively short programming times, and super pages super pages SP 6 and SP 7 comprising MSB pages having relatively long programming time. Large interleaving units L-IU 0 and L-IU 1 are programmed in an interleaved fashion as illustrated in FIG. 6A. In large interleaving unit L-IU 0, the order of programming is LSB page SP 0, LSB page SP 1, MSB page SP 4, and MSB page SP 5.

Figure 6B:
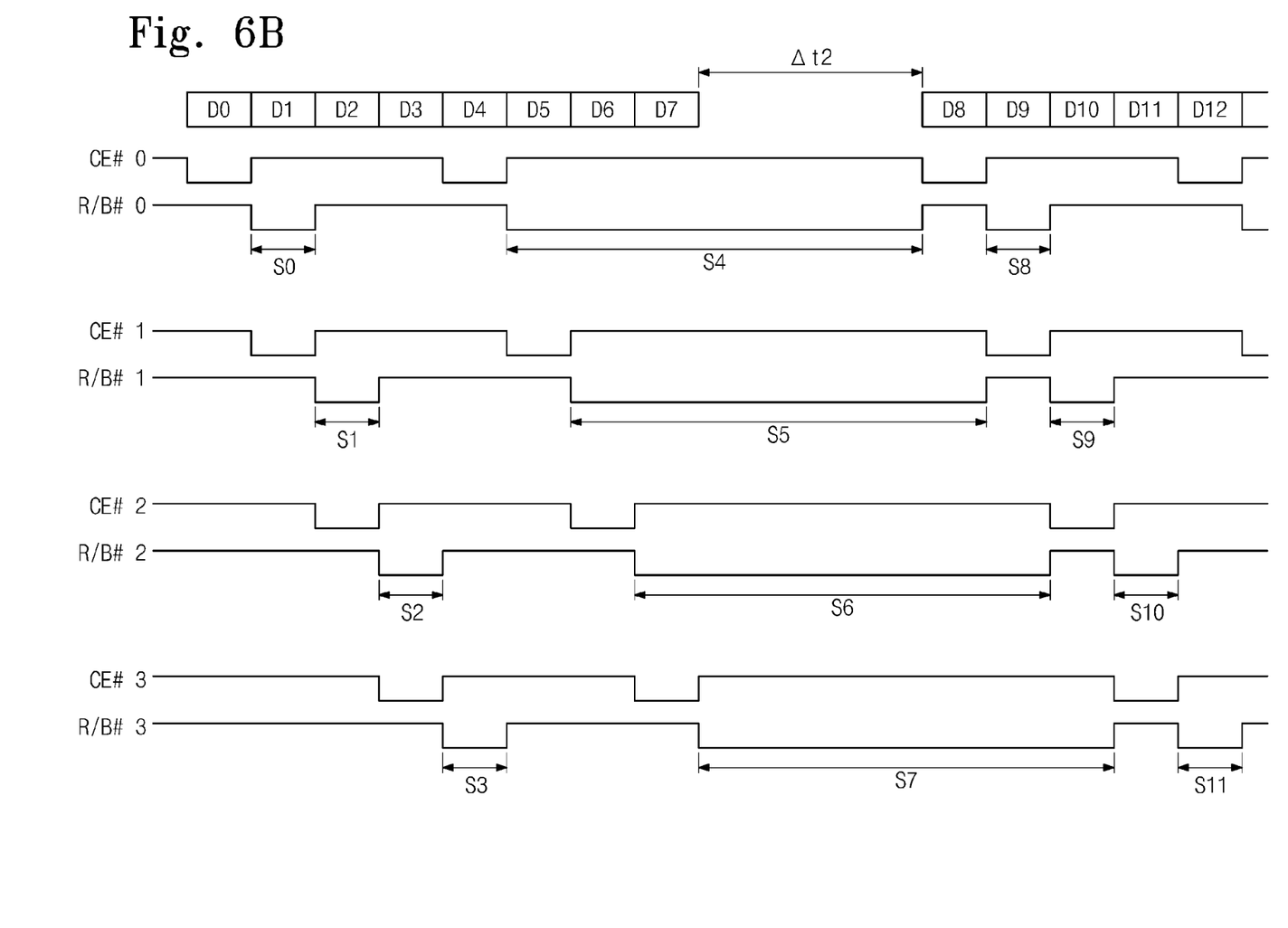
FIG. 6B is a timing diagram illustrating another method of programming a nonvolatile memory device according to an embodiment of the inventive concept.

FIG. 6B is a timing diagram illustrating another method of programming a nonvolatile memory device. This method programs data D0-D12, similar to the method of FIG. 6A. The method of FIG. 6B uses the super page designations indicated in FIG. 5A.

Referring to FIGS. 2, 4 and 6B, memory controller 220 sequentially programs super pages in flash memory devices 231, 241, 251 and 261 connected to channel CH 0. Memory controller 220 executes an interleaving operation in the order of super pages during an interval S0-S11 where flash memory devices 231, 241, 251 and 261 perform programming operations. For instance, memory controller 220 executes a setup operation for programming super page SP 1 of second flash memory device 241 for a time S0 while super page SP 0 of first flash memory device 231 is programmed.

Memory controller 220 sets up a first command, an address and data D7 for programming super page SP 7, and thereafter, waits for a standby time $\Delta t2$ until a setup operation begins on a first command, an address and data D8 for programming super page SP 8. Standby time $\Delta t2$ is longer than the standby time $\Delta t1$, so the method of FIG. 6A is more efficient than the method of FIG. 6B.

Figure 7:
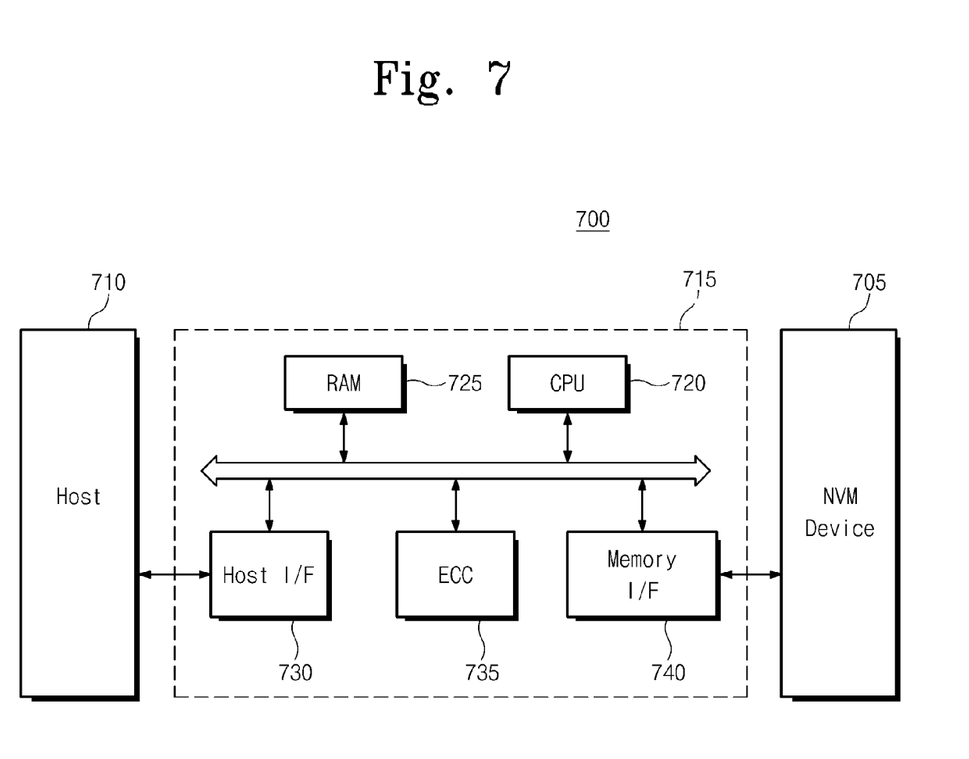
FIG. 7 is a block diagram illustrating a memory system according to an embodiment of the inventive concept.

FIG. 7 is a block diagram illustrating a memory system 700 according to an embodiment of the inventive concept. Referring to FIG. 7, memory system 700 comprises a nonvolatile memory device 705 and a memory controller 715. Memory controller 715 controls data exchange between nonvolatile memory device 705 and a host 710. Memory controller 715 uses an interleaving scheme such as that illustrated in FIGS. 5 and 6.

Memory controller 715 comprises a central processing unit (CPU) 720, an SRAM 725, a host interface 730, an error correction unit 735, and a memory interface 740, all connected to each other via a bus.

CPU 720 performs control operations for data exchange between memory controller 715 and other elements. SRAM 725 is used as the working memory of CPU 720. Host interface 730 implements a data exchange protocol between memory system 700 and host 710. Error correction unit 735 uses error correction codes (ECCs) to analyze and correct errors in data read from multi-bit nonvolatile memory device 705. Memory interface 740 interfaces nonvolatile memory device 705. Although not shown, memory system 700 may further comprise a read only memory (ROM) storing code for interfacing with host 710.

Figure 8:
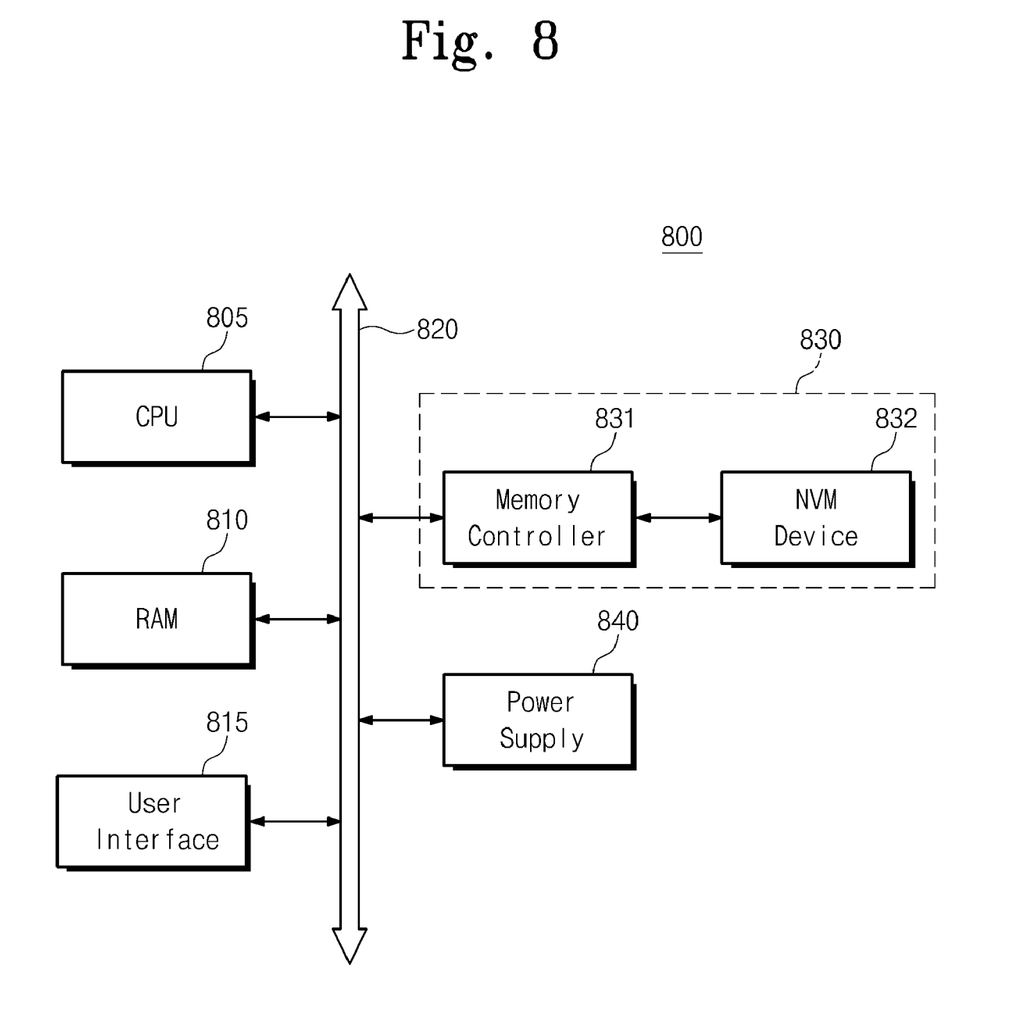
FIG. 8 is a block diagram illustrating a memory system according to another embodiment of the inventive concept.

FIG. 8 is a block diagram illustrating a memory system 800 according to another embodiment of the inventive concept.

Referring to FIG. 8, memory system 800 comprises a CPU 805, a random access memory 810, a user interface 815, a system bus 820, a nonvolatile memory system 830, and a power supply 840. Nonvolatile memory system 830 is electrically connected to the CPU 805, RAM 810, user interface 815 and power supply 840 via system bus 820.

Nonvolatile memory system 830 comprises a memory controller 831 and a nonvolatile memory device 832. Nonvolatile memory system 830 implements an interleaving scheme such as that illustrated in FIGS. 5 and 6. The scheme could be performed, for instance, with data received via user interface 815 or processed by CPU 805, and under the control of memory controller 831. Although not shown, an application chipset and a camera image processor may be further provided in memory system 800 in certain embodiments of the inventive concept.

The flash memory device or memory controller in certain embodiments of the inventive concept can be mounted in various types of packages. For example, the flash memory device and/or memory controller can be mounted in packages having any of several configurations such as package on package (PoP), ball grid arrays (BGA), chip scale package (CSP), plastic leaded chip carrier (PLCC), plastic dual in-line package (PDIP), die in waffle pack (DIWP), die in wafer form (DIWF), chip on board (COB), ceramic dual in-line package (CERDIP), plastic metric quad flat pack (MQFP), thin quad flat pack (TQFP), small outline package (SOP), shrink small outline package (SSOP), thin small outline package (TSOP), thin quad flat pack (TQFP), system in package (SIP), multi chip package (MCP), wafer level stack package (WLSP), die in wafer form (DIWF), die on waffle package (DOWP), wafer-level fabricated package (WFP) and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of programming a memory system comprising a plurality of nonvolatile memory devices connected to a common input/output channel, the method comprising:
   determining programming times for data regions of the plurality of nonvolatile memory devices, wherein some of the data regions have a first programming time and some of the data regions have a second programming time longer than the first programming time;
   defining an interleaving unit comprising a data region having the first programming time and a data region having the second programming time in a first nonvolatile memory device, and a data region having the first programming time and a data region having the second programming time in a second nonvolatile memory device; and
   programming the data regions of the interleaving unit in a sequence beginning with the data regions having the first programming time, followed by the data regions having the second programming time.

2. The method of claim 1, further comprising:
   defining a second interleaving unit comprising at least one data region having the first programming time and at least one data region having the second programming time from each of a different two of the plurality of nonvolatile memory devices; and
   programming the second interleaving unit in an interleaved fashion with the first interleaving unit.

3. The method of claim 1, wherein determining the programming times for the data regions comprises programming the data regions, and measuring the time required to perform the programming.

4. The method of claim 1, wherein determining the programming times for the data regions comprises reading a stored indication of the programming times.

5. The method of claim 1, wherein the data regions having the first programming times correspond to least significant bit data in multi-bit memory cells.

6. The method of claim 1, wherein the data regions having the second programming times correspond to most significant bit data in multi-bit memory cells.

7. The method of claim 1, wherein the nonvolatile memory devices comprise flash memory devices, and data regions comprise pages of flash memory cells.

8. The method of claim 1, wherein the nonvolatile memory devices comprise flash memory devices, and data regions comprise super-pages of flash memory cells, each super-page comprising one or more pages of data from one memory block, and one or more pages of data from another memory block.

9. A method of configuring an interleaving unit in a memory system comprising a plurality of nonvolatile memory devices and a memory controller, the method comprising:
selecting a plurality of memory cell regions of the nonvolatile memory devices as a programming time measurement group;
executing programming operations on the selected memory cell regions and recording programming times of the selected memory cell regions based on the programming operations; and
configuring an interleaving unit to be used as a unit of an interleaving operation based on the recorded programming times.

10. The method of claim 9, further comprising measuring the programming times of the selected memory cell regions by monitoring a ready/busy signal of one or more of the nonvolatile memory devices during a programming operation to determine the duration of the programming operation.

11. The method of claim 9, wherein executing programming operations on the selected memory cell regions and recording the programming times of the selected memory cell regions comprises an iterative process comprising a plurality of loops each comprising programming a single memory cell region and recording a characteristic of the single memory cell region.

12. The method of claim 11, wherein the characteristic of the memory cell region is a programming time.

13. The method of claim 9, wherein recording the programming times comprises is performed by a timer or counter of the memory controller.

14. The method of claim 9, wherein the interleaving unit comprises a first memory cell region having a first programming time and a second memory cell region having a second programming time greater than the first programming time.

15. The method of claim 14, wherein the interleaving unit comprises at least one data region having the first programming time and at least one data region having the second programming time from each of two different nonvolatile memory devices.

16. The method of claim 14, wherein the first memory cell region comprises a page of lower bit data in a flash memory device, and the second memory cell region comprises a page of upper bit data in the flash memory device.

17. A memory system, comprising:
a plurality of nonvolatile memory devices; and
a memory controller that exchanges data with the nonvolatile memory devices through at least one channel, selects a plurality of memory cell regions of the nonvolatile memory devices as a programming time measurement group, executes programming operations on the selected memory cell regions and recording programming times of the selected memory cell regions based on the programming operations, and configures an interleaving unit to be used as a unit of an interleaving operation based on the recorded programming times;
wherein the nonvolatile memory devices comprise a first nonvolatile memory device and a second nonvolatile memory device, and
wherein the memory controller sequentially drives first and second programming units in the first and second nonvolatile memory devices, the first programming units having a first programming time, and the second programming units having a second programming time longer than the first programming time.

18. The memory system of claim 17, wherein the memory controller measures the programming times of the selected memory cell regions by performing an iterative process comprising a plurality of loops each comprising programming a single memory cell region and recording a programming time of the single memory cell region.

19. The memory system of claim 17, wherein the interleaving unit comprises a small interleaving unit or a large interleaving unit, wherein the small interleaving unit comprises a programming unit having a first programming time and a programming unit having a second programming time greater than the first programming time, and wherein the large interleaving unit comprises at least two small interleaving units.

20. The memory system of claim 17, wherein an interleaving operation of the memory system is performed by interleaving the programming of at least two small interleaving units and interleaving the programming of at least two large interleaving units.

* * * * *